United States Patent [19]

Collins et al.

[11] Patent Number: 5,583,737
[45] Date of Patent: Dec. 10, 1996

[54] ELECTROSTATIC CHUCK USABLE IN HIGH DENSITY PLASMA

[75] Inventors: Kenneth S. Collins; John R. Trow, both of San Jose; Joshua Chiu-Wing Tsui, Santa Clara; Craig A. Roderick, San Jose; Nicolas J. Bright, Saratoga; Jeffrey Marks, San Jose, all of Calif.; Tetsuya Ishikawa, Chiba, Japan; Jian Ding, San Jose, Calif.

[73] Assignee: Applied Materials, Inc., Santa Clara, Calif.

[21] Appl. No.: 452,351

[22] Filed: May 26, 1995

Related U.S. Application Data

[60] Division of Ser. No. 137,279, Oct. 14, 1993, which is a continuation-in-part of Ser. No. 984,797, Dec. 2, 1992, Pat. No. 5,350,479.

[51] Int. Cl.$^6$ .................................................. H02N 13/00
[52] U.S. Cl. .................................................. 361/234
[58] Field of Search .............................. 361/234; 279/128

[56] References Cited

U.S. PATENT DOCUMENTS

| | | |
|---|---|---|
| 3,989,301 | 9/1976 | Livesay . |
| 4,565,601 | 1/1986 | Kakehi et al. . |
| 4,645,218 | 2/1987 | Ooshio . |
| 4,771,730 | 9/1988 | Tezuka . |
| 4,931,135 | 6/1990 | Horiuchi et al. . |
| 5,055,964 | 10/1991 | Logan et al. . |
| 5,103,367 | 4/1992 | Horwitz . |
| 5,117,121 | 5/1992 | Watanabe et al. . |
| 5,151,845 | 9/1992 | Watanabe . |
| 5,179,498 | 1/1993 | Hongoh et al. . |
| 5,221,450 | 6/1993 | Hattori et al. . |
| 5,250,137 | 10/1993 | Arami et al. . |
| 5,255,153 | 10/1993 | Nozawa et al. . |
| 5,310,453 | 5/1994 | Fukasawa et al. .................. 156/643 |
| 5,350,479 | 9/1994 | Collins et al. . |
| 5,382,311 | 1/1995 | Ishikawa et al. .................. 156/345 |
| 5,460,684 | 10/1995 | Saeki et al. ...................... 156/345 |

FOREIGN PATENT DOCUMENTS

| | | |
|---|---|---|
| 0328078A2 | 8/1989 | European Pat. Off. . |
| WO90/01374 | 2/1990 | European Pat. Off. . |
| 0452222A1 | 10/1991 | European Pat. Off. . |
| 0462563A1 | 12/1991 | European Pat. Off. . |
| 64-18236 | 1/1989 | Japan . |
| 1-251735A | 10/1989 | Japan . |
| 4253356 | 9/1992 | Japan . |

*Primary Examiner*—Fritz M. Fleming
*Attorney, Agent, or Firm*—Fish & Richardson, P.C.

[57] ABSTRACT

An electrostatic chuck for holding a wafer in a plasma processing chamber, the chuck including a pedestal having a top surface, an internal manifold for carrying a cooling gas, and a first plurality of holes leading from the internal manifold toward said top surface; and a dielectric layer on the top surface of the pedestal. The dielectric layer has a top side and second plurality of holes, each of which is aligned with a different one of the holes of the first plurality of holes in the pedestal. The first and second holes form a plurality of passages extending from the internal manifold to the top side of the dielectric layer and through which the cooling gas is supplied to the backside of the wafer. Each of the first holes and the second hole aligned therewith form a different one of the plurality of passages. The passages are concentrated in regions of the dielectric layer that are in proximity to regions of higher leakage of cooling gas when the wafer is held against the electrostatic chuck by an electrostatic force.

14 Claims, 12 Drawing Sheets

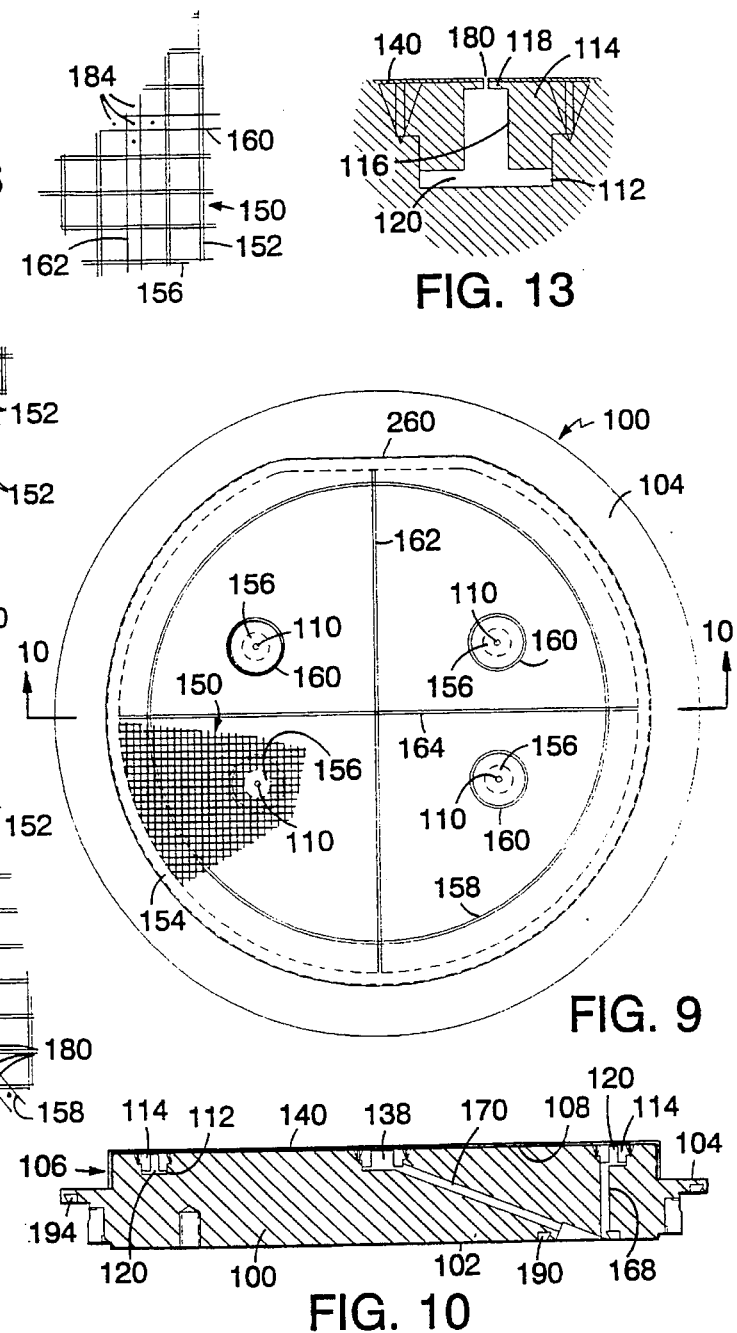

ELECTROSTATIC CHUCK USABLE IN HIGH DENSITY PLASMA

This is a divisional of U.S. patent application Ser. No. 08/137,279, filed Oct. 14, 1993, which is a continuation-in-part of U.S. Pat. Ser. No. 984,797 filed Dec. 2, 1992, now U.S. Pat. No. 5,350,479, issued on Sep. 27, 1994, incorporated herein by reference.

FIELD OF THE INVENTION

The present invention relates to an electrostatic chuck ("E-chuck") for high density plasma processing of articles such as semiconductor wafers. The E-chuck overcomes the difficulties present with prior art mechanical and electrostatic chucks in high density plasma processing applications and is particularly well suited to processes in which the article may be RF biased for enhanced process performance in a high density plasma process, such as that used in $SiO_2$ etching. The E-chuck addresses the requirements of uniform coupling of electrical and thermal energy in a hostile electrical, thermal and chemical environment.

BACKGROUND OF THE INVENTION

In the plasma processing of articles such as semiconductor wafers, a common problem is the coupling of electrical energy to the article being processed. Typically, electromagnetic coupling of RF energy into the "source" region of a plasma chamber is employed to generate and maintain a high electron density plasma having a low particle energy. In addition, RF "bias" energy is usually capacitively coupled in the plasma via the article being processed to increase and control the energy of ions impinging on the article.

In a typical high density plasma reactor, the driving point RF "bias" impedance presented by the plasma is very low. To achieve uniform ion energy and flux to the article being processed (typically essential for etching or other plasma processes), uniform coupling of RF "bias" energy through the article being processed to the plasma is required. The article being processed typically is held against some kind of chuck and RF bias energy is applied to the chuck. What is desired is a constant plasma sheath voltage across the surface of the article being processed.

The degree to which such a uniform plasma sheath voltage can be achieved is a function not only of the plasma density uniformity as generated by the plasma source, but is also a function of the impedance per unit area of the plasma sheath adjacent to the article, the impedance per unit area of the article, the impedance per unit area of any gap between the article and the chuck and the impedance per unit area of the chuck.

Besides electrical coupling, the chuck should be tightly thermally coupled to the article being processed. Typically the temperature of the article is a process parameter to be controlled and this normally means removing heat from or adding heat to the article during processing. Heat transfer in a low pressure or vacuum environment such as that used for plasma processing is generally poor. Some means of providing for adequate heat transfer between the article being processed and adjacent surfaces is usually necessary.

Typical prior art chucks mechanically clamp an article to the chuck with a clamp ring applying a holding force at the periphery of the article. The thermal contact between article and chuck is generally insufficient to accommodate the heat load imposed by the plasma on the article. Without some means of improved thermal contact between article and chuck, the temperature of the article may rise out of acceptable limits.

Gas is typically introduced between the article and chuck to enhance thermal contact and heat transfer from the article to the chuck. The gas pressure required is a function of the heat load imposed by the plasma, the desired maximum article temperature, the temperature at which the chuck can be maintained (such as with liquid cooling), the choice of cooling gas and the article/gas and gas/chuck accommodation coefficients (measures of how effectively heat is transferred between a gas and a surface). For biased high density plasma applications, helium gas is used as the cooling gas and the gas pressure required is typically in the 5 to 30 torr range.

For "low pressure" plasma processes (those operating in millitorr pressure range), some means must be provided to allow a significantly higher pressure in the region between the article and chuck with respect to the ambient pressure in the process chamber. In addition, a leak of cooling gas into the process environment may produce undesirable results. Typically some kind of seal, usually an elastomer, is used to allow maintenance of the pressure difference between the two regions.

If the article to be processed is simply mechanically clamped at its periphery to the chuck, and gas introduced between article and chuck, the article will bow away from the chuck due to the pressure difference across the article. If a flat chuck is used on a disk shaped article, a large gap results between the article and the chuck with a peak gap at the center. Under such conditions, thermal and electrical coupling between the article and the chuck are non-uniform. Mechanically clamped chucks typically pre-compensate such article-bowing by attempting to match the chuck's surface to the curvature of the article under stress. Theoretically, this can be done for simply shaped articles (such as disks), but the presence of discontinuities or complex shapes make analytical precompensation impossible, and trial-and-error is required. Mismatches in curvatures between the article and the chuck result in a variable gap between such surfaces, resulting in non uniform electrical and thermal coupling.

Electrostatic chucks have been proposed to overcome the non-uniform coupling associated with mechanical chucks. Electrostatic chucks employ the attractive coulomb force between oppositely charged surfaces to clamp together an article and a chuck. In principle, with an electrostatic chuck, the force between article and chuck is uniform for a flat article and flat chuck. The electrostatic force between the article and the chuck is proportional to the square of the voltage between them, proportional to the relative permittivity of the dielectric medium separating them (assuming conductivity is negligible) and inversely proportional with the square of the distance between them. Typically for biased-article high density plasma processing applications (such as $SiO_2$ etching) a cooling gas is required to improve the heat transfer between article and chuck to acceptable levels. Introduction of gas cooling between article and chuck, while required to achieve adequate heat transfer, causes problems with prior art electrostatic chucks when used in biased-article high density plasma applications.

In particular, the requirement of introducing cooling gas in the region between article and chuck requires that some discontinuity be introduced in the chuck surface, typically some type of hole(s) through the chuck to a gas passage behind the surface. The introduction of any discontinuity in the chuck surface distorts the electric field in the vicinity of the discontinuity, making arc breakdown and glow discharge breakdown of the cooling gas more probable. With DC bias applied between an article and a chuck, and RF bias applied to the chuck, gas breakdown becomes probable with prior art electrostatic chucks such as described in U.S. Pat. Nos. 4,565,601 and 4,771,730.

In the '601 patent, a plurality of radial cooling gas dispersion grooves in an upper surface of a plate electrode connect to and extend outwardly from the relatively large upper end of a cooling gas supply pipe extending vertically to the upper surface of the plate electrode. Cooling gas from the supply pipe travels outwardly in the radial grooves and into a plurality circular gas dispersion grooves also formed in the upper surface of the plate electrode coaxial with the gas supply pipe. The upper surface of the plate electrode with the radial and circular patterns of grooves is covered with a thin insulating film upon which the article to be process is placed. The upper open end of the gas supply pipe forms a relatively large discontinuity in the upper surface of plate electrode. The radial and circular grooves are relatively wide and deep, slightly less than the diameter of the gas supply pipe, and form additional relatively wide and deep discontinuities in the upper surface of the plate electrode and relatively deep separation gaps between the plate electrode and the article to be processed. Further, irregularities in the coated surfaces of the grooves produce non-uniformities in gas flow and in the spacing of the article and the plate electrode. Undesired arc and glow discharge breakdowns of the cooling gas would occur if such an electrostatic chuck were employed in a high RF power, high density plasma reactor.

The same problems are particularly inherent in the electrostatic chuck of the '730 patent which includes a central and/or plurality of relatively large gas feeding tubes to the upper surface of a plate electrode.

What is desired is an electrostatic chuck that can accommodate cooling gas between the workpiece and the chuck and which is designed to avoid gas breakdown even when the chuck is used in a plasma reactor environment including high RF bias power and high density plasma.

SUMMARY OF THE INVENTION

The E-chuck of the present invention is particularly useful in electrostatically holding an article to be processed, such as a semiconductor wafer, in a plasma reaction chamber while distributing a cooling gas between the face of the E-chuck and the underside of the article, without contributing to arc or glow discharge breakdown of the cooling gas.

The E-chuck comprises a metal pedestal having a smooth upper surface for electrostatically attracting and supporting the article. A smooth layer of a dielectric material is bonded to the upper surface of the pedestal.

One aspect of the present invention is that one or more conduits are formed inside the metal pedestal to permit cooling gas to be transported to one or more cavities just below the dielectric. A plurality of perforations which are much smaller in diameter than the conduits extend from the upper surface of the dielectric down to the cavities. These perforations provide a path for the cooling gas to flow from the cavities in the pedestal to the region between the dielectric layer and the semiconductor wafer or other workpiece. The invention permits the use of perforations which are much smaller in diameter than the smallest conduit that could be fabricated in the body of the metal pedestal. The use of such small perforations as the outlets for the cooling gas greatly increases the amount of RF bias power and plasma density to which the E-chuck can be exposed without causing breakdown of the cooling gas.

A second, independent aspect of the invention is that a cooling gas distribution channel is formed by one or more grooves in the upper surface of the dielectric layer for distributing a cooling gas between the upper surface of the dielectric layer and the underside of the article supported on the pedestal. According to this aspect of the invention, the depth of the grooves is small enough to maintain a low product of cooling gas pressure and groove depth so as to avoid glow discharge breakdown of the cooling gas, and the dielectric layer beneath the grooves is thick enough to prevent dielectric breakdown. In contrast with conventional E-chucks, the present invention locates the gas distribution channels in the layer of dielectric material rather than in the metal pedestal, thereby minimizing discontinuities in the electric field adjacent the pedestal which could contribute to arc or glow discharge breakdown of the cooling gas.

In general, in another aspect the invention is an electrostatic chuck for holding a wafer in a plasma processing chamber. The electrostatic chuck supplies a cooling gas to the backside of the wafer through a plurality of holes in the chuck that are distributed near the regions of highest leakage of the cooling gas, i.e., the holes are distributed so as to "feed the leaks" while also supplying gas to the backside of the wafer. The chuck includes a pedestal having a top surface, an internal manifold for carrying a cooling gas, and a first plurality of holes leading from the internal manifold toward the top surface. It also includes a dielectric layer on the top surface of the pedestal. The dielectric layer has a top side and second plurality of holes, each of which is aligned with a different one of the holes of the first plurality of holes. The first and second holes forming a plurality of passages extending from the internal manifold to the top side of the dielectric layer and through which the cooling gas is supplied to an interface formed by the backside of the wafer and the top side of the dielectric layer. Each of the first holes and the second hole aligned therewith form a different one of the plurality of passages. The passages are concentrated in regions of said dielectric layer that are in proximity to regions of higher leakage of cooling gas when the wafer is held against the electrostatic chuck by an electrostatic force.

In general, in yet another aspect the invention is an electrostatic chuck in which an internal gas distribution manifold is formed by welding an insert into a groove in the top of the chuck. In particular, the electrostatic chuck includes a pedestal having a top surface, an internal manifold for carrying a cooling gas, and a first plurality of holes connecting the internal manifold to the top surface; and it includes a dielectric layer on top of the pedestal. The dielectric layer has a second plurality of holes, each of which is aligned with a different one of the holes of the first plurality of holes. The first and second holes form a plurality of passages extending from the internal manifold to the top of the dielectric layer and through which the cooling gas is supplied to a wafer backside. Each of the first holes and the second hole aligned therewith form a different one of the plurality of passages. The pedestal includes a groove formed in its top surface and there is an insert in the groove. The insert has a channel formed in its underside and the channel in combination with the groove form a cavity that is part of the internal manifold. At least some of the passages pass through the insert into that channel.

In general, in still another aspect, the invention is a computer-implemented method for preparing an electrostatic chuck within a plasma chamber to receive a next wafer for plasma processing after a previous wafer has completed plasma processing. The method includes the steps of removing the previous wafer from the electrostatic chuck in the plasma chamber; introducing a non-process gas into the plasma chamber without any wafer present on the electrostatic chuck; striking a plasma in the plasma chamber; running that plasma for a preselected period of time; terminating the plasma at the end of the preselected period; and placing the next wafer on the electrostatic chuck for plasma processing.

In general, in another aspect, the invention is a method of forming passages in an electrostatic chuck that connect an internal manifold to the top surface of the dielectric. The method includes the steps of drilling a first plurality of holes into the pedestal extending from the top surface of the pedestal into the manifold; forming a dielectric layer on the surface of the pedestal, the dielectric layer being sufficiently thick to bridge over the holes of the first plurality of holes; and drilling a second plurality of holes in the dielectric layer, each hole of the second plurality of holes aligned with a different one of the holes of the first plurality of holes.

In general, in still another aspect, the invention is a method for dechucking a wafer from a electrostatic chuck following a plasma process. The method includes the steps of: at the completion of the plasma process and while the RF source power is still on, turning off the cooling gas; changing a DC potential of the electrostatic chuck; slightly separating the wafer from the electrostatic chuck while the RF source plasma is still present; after slightly separating the wafer from the electrostatic chuck, turning off the RF source; after turning off the RF source power, separating the wafer further from the electrostatic chuck; and removing the wafer from the plasma chamber.

Other advantages and features will become apparent from the following descriptions of the preferred embodiments and from the claims.

BRIEF DESCRIPTION OF THE DRAWING

FIG. 9 shows an alternative embodiment of the pedestal which includes a Helium cooling gas distribution system that introduces Helium cooling gas around the periphery and around the lift pin holes;

FIG. 10 shows a cross-section of the pedestal of FIG. 9 taken along the A—A section line in FIG. 9;

FIG. 13 shows an enlarged view in cross-section of the large annular insert ring;

FIG. 14 shows a closeup of the groove network on the surface of the dielectric layer;

FIG. 15 shows a closeup of another portion of the groove network on the surface of the dielectric layer;

FIG. 16 shows a closeup of yet another portion of the groove network on the surface of the dielectric layer;

DESCRIPTION OF THE PREFERRED EMBODIMENTS

Figure 1:
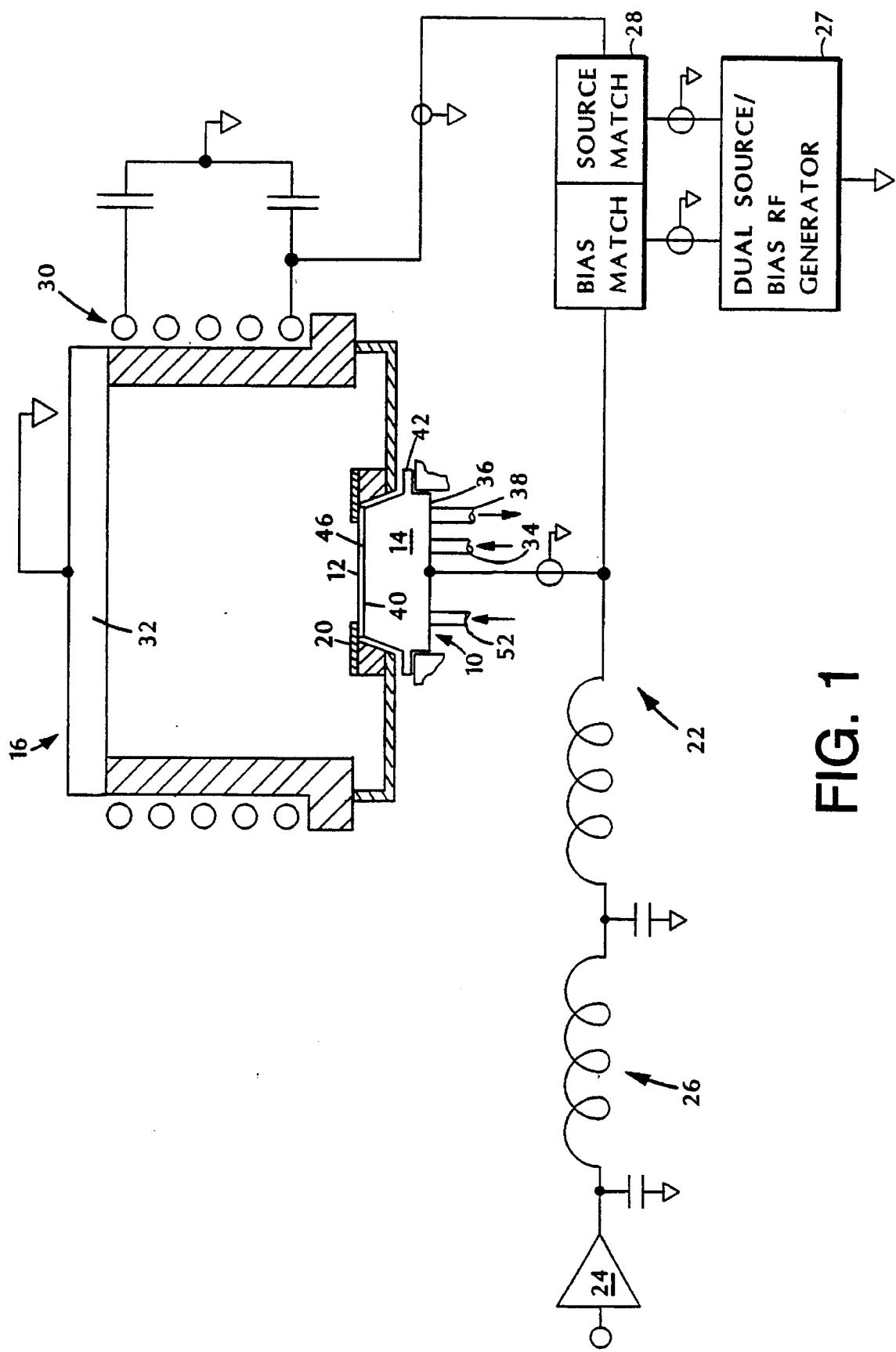
FIG. 1 is a schematic of the OMEGA biased high density plasma reaction chamber of Applied Materials, Inc., Santa Clara, California illustrating the electrical circuitry therefor and including the E-chuck of the present invention to hold a semiconductor wafer on a pedestal of the E-chuck. The OMEGA reaction chamber (without a chuck) is described and illustrated in greater detail in the copending patent application Ser. No. 07/941,507, filed Sep. 8, 1992 for "Plasma Reactor Using Electromagnetic RF Coupling" and assigned to the same assignee as the present invention. The copending patent application is hereby incorporated by reference to complete the description of the OMEGA reaction chamber in which the E-chuck of the present invention is particularly useful.
Figure 2:
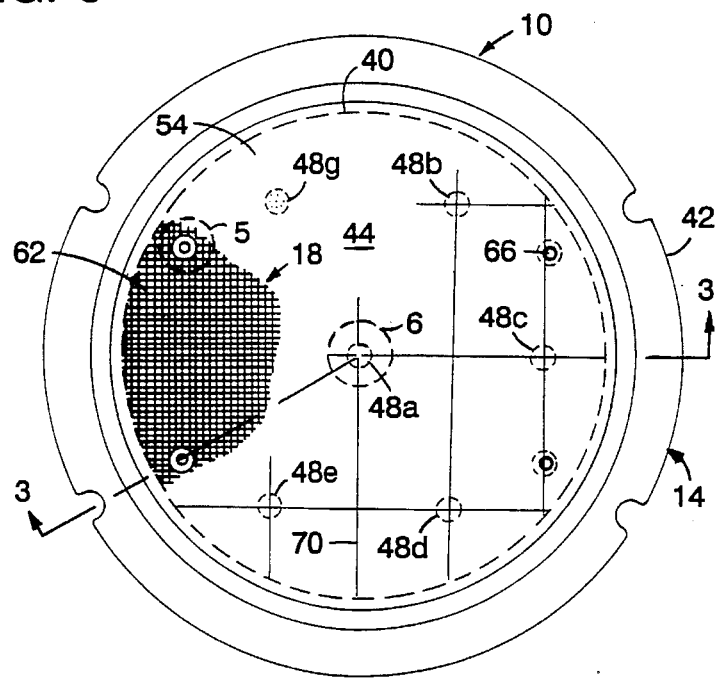
FIG. 2 is top view of a pedestal included in the E-chuck of the present invention and illustrates a gas distribution system formed in the upper surface of a layer of dielectric material bonded to the upper surface of the pedestal to distribute cooling gas over the surface of the layer from cooling gas receiving holes extending upwardly from an underside of the pedestal to upper ends adjacent the upper surface of the pedestal under the layer of dielectric material.

As shown in FIGS. 1 and 2, the E-chuck 10 of the present invention is adapted to support and electrostatically hold an article or workpiece 12 to be processed, such as a semiconductor wafer, on a pedestal 14 within a high density plasma reaction chamber 16. Through gas distribution groove network 18, the E-chuck 10 affects a cooling of the pedestal 14 and the wafer 12 supported thereon.

The plasma reaction chamber 16 further includes a cover ring 20 which is supported by four rods, not shown. The purpose of the cover ring is to prevent the plasma in the chamber above the workpiece from contacting, and thereby corroding, part of the E-chuck. Accordingly, the four rods position the cover ring within 0.01 inch of the edges of the workpiece and the E-chuck, a gap too small for the plasma to penetrate. The rods lift the cover away from the wafer and E-chuck when the wafer is being transported to or from the E-chuck.

For a more detailed understanding of the plasma reaction chamber 16 and its operation in processing the wafer 12, the reader should refer to the drawings and detailed description contained in the previously referred to patent application Ser. No. 07/941,507 incorporated by reference into this patent application.

As shown in FIG. 1, the electrical circuit for the plasma reaction chamber 16 is conventional. It includes a conventional DC voltage source 24 which supplies the clamping voltage which is coupled to the E-chuck 10 through a low pass filter 26 which isolates the DC voltage source 24 from the RF power supply 27. RF source power and RF bias power are each coupled from the conventional RF power supply 27 through a matching network 28, with the source power being coupled to an inductive antenna 30 and the bias power being coupled to the pedestal 14. A ground reference for both the RF bias power and DC voltage is a grounded top counter electrode 32. The DC voltage source 24 supplies −1000 volts for developing an electric field which electrostatically holds the wafer 12 to the pedestal 14. When it is desired to release (or "de-chuck") the wafer 12, the source 24 may be switched either to a zero output voltage or to a reverse polarity voltage if it is desired to accelerate the release of the wafer.

The plasma reaction chamber 16 employs inductively-coupled RF power to generate and maintain a high density, low energy plasma. RF bias power is capacitively coupled to the plasma via the wafer 12 and E-chuck 10, with the grounded counter electrode 32 located in the plasma source region providing a return path for bias current. With the configuration shown in FIG. 1, plasma density is controlled by the RF source power, and ion energy is independently controlled by the RF bias power. The result is a uniform high density, low electron temperature plasma at the wafer 12 with ion energy controllable from about 15 eV to several hundred eV. This configuration allows for etching of the wafer 12 with minimum charge up degradation and minimum energetic-particle damage.

While the above described plasma reaction chamber 16 provides a high oxide etch rate, it does impose some severe hardware requirements, particularly on the E-chuck 10. In particular, RF bias power must be uniformly coupled to the wafer 12 and to the plasma. With a high density, low electron temperature plasma, the cathode sheath is very thin, usually less than one millimeter, and the impedance per unit area of the cathode sheath is primarily resistive and quite low. For wafers of typical resistivity, unless RF bias is very uniformly coupled to the wafer, ion/electron current and ion energy will not be uniform. In addition to the problem of uniform electrical coupling, tight uniform thermal coupling of the wafer 12 is very large. For example, at a typical RF source power of 2800 watt and RF bias power of 1400 watt, approximately 2 KW of heat must removed continuously from the wafer.

Figure 2A:
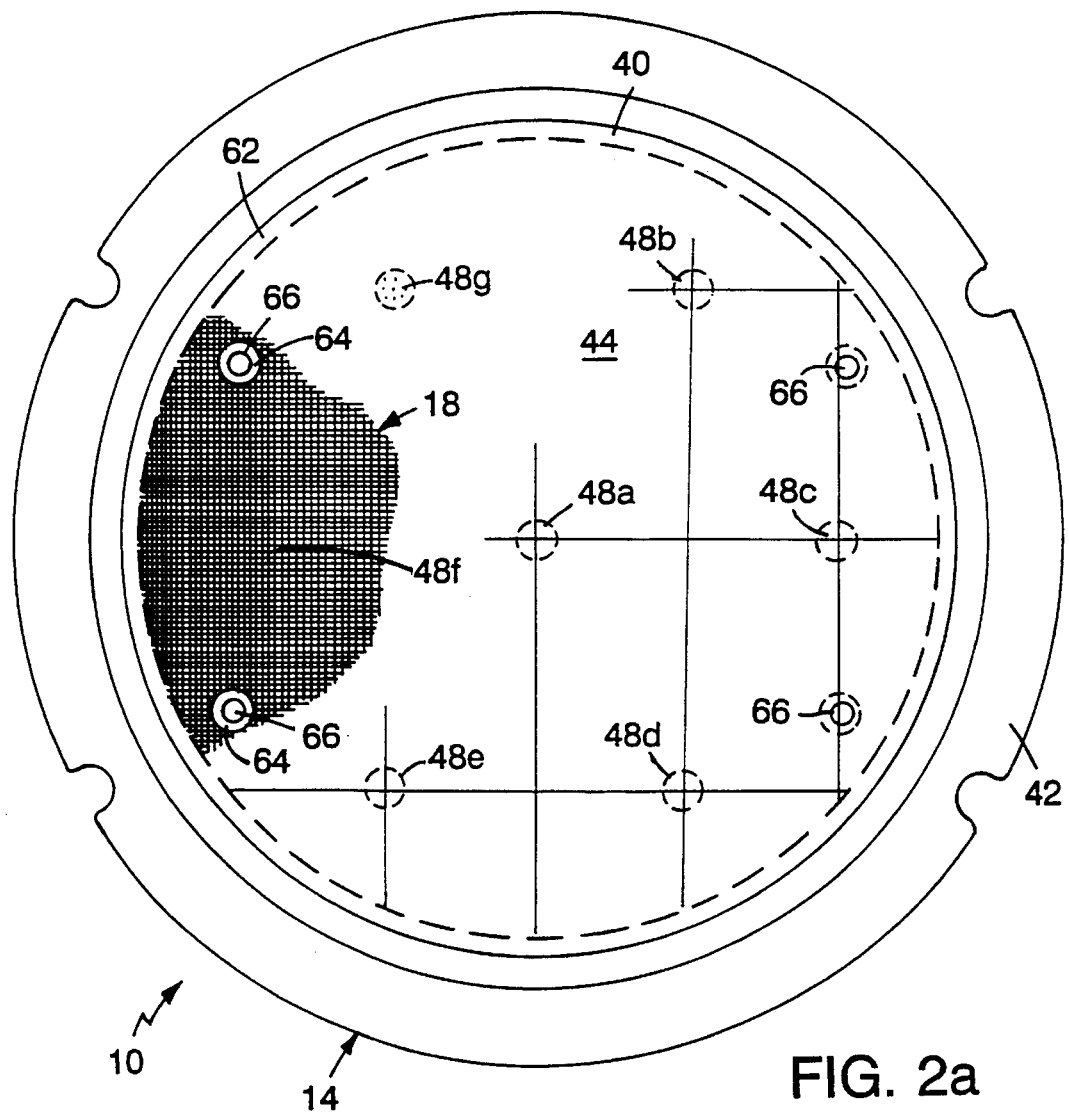
FIG. 2a is an enlarged showing of FIG. 2.
Figure 3A:
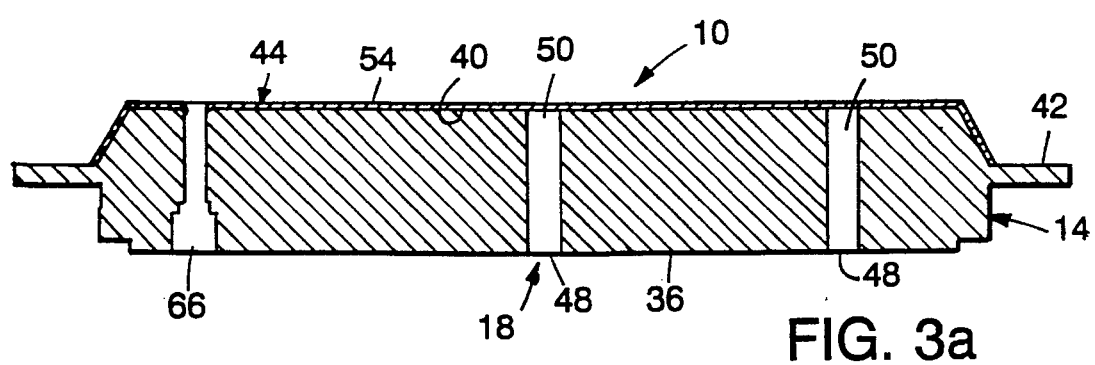
FIG. 3a is an enlarged version of FIG. 3.
Figure 6A:
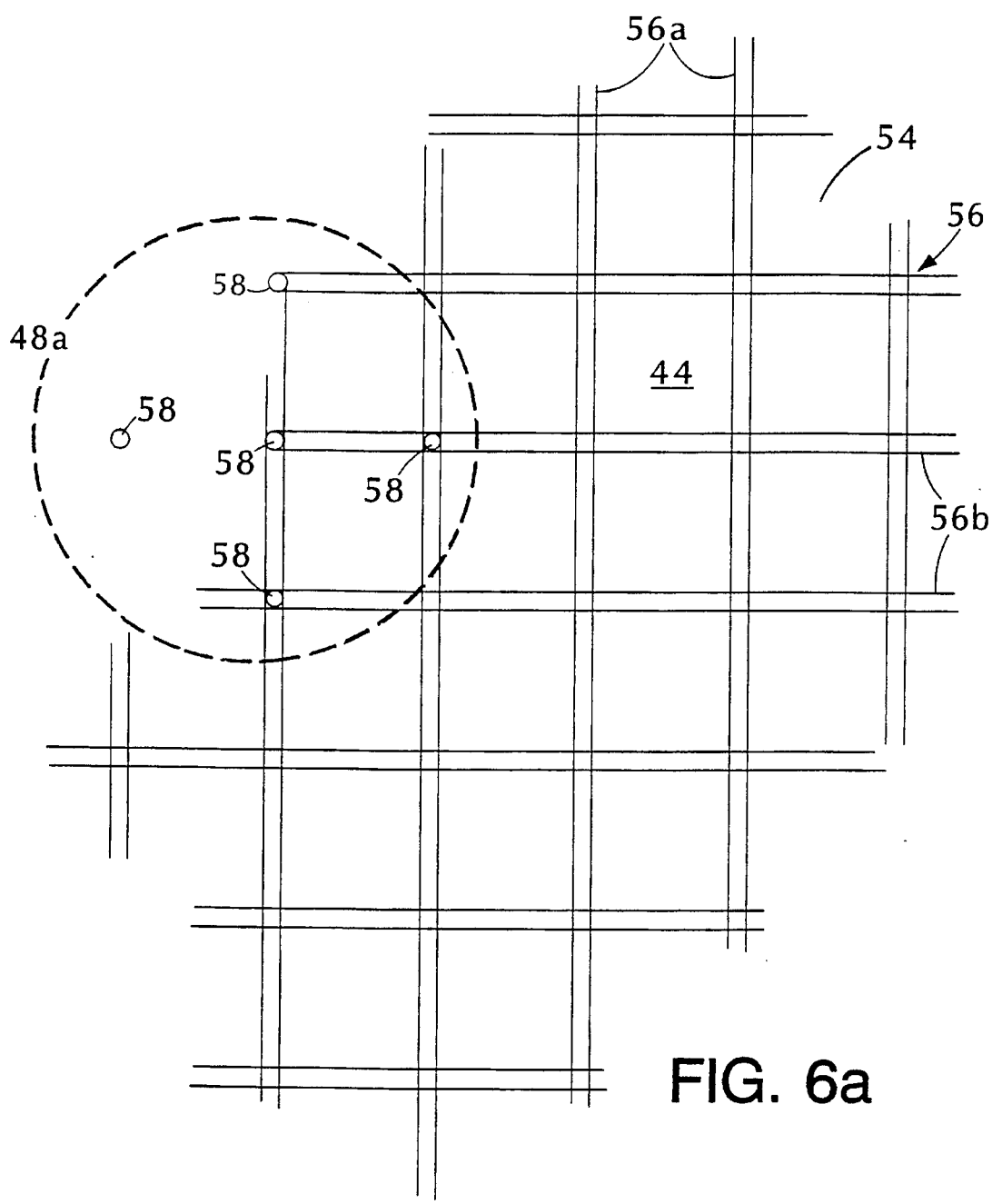
FIG. 6a is an enlarged showing of FIG. 6.

To provide for such uniform coupling and thermal cooling, the pedestal 14 in the E-chuck 10 of the present invention preferably comprises a one piece aluminum block with direct liquid cooling. Such liquid cooling is provided by cooling water entering an inlet 34 at an underside 36 of the pedestal 14 and traveling through cooling passages (not shown) to exit the pedestal through an outlet 38. More particularly, as illustrated in FIGS. 2 and 2a, the pedestal 14 comprises a short cylindrical block of aluminum having a flat upper surface 40 and flat underside 36 with an annular mounting flange 42 extending outwardly from an outer surface of the block comprising the pedestal. The voltage applied to the pedestal 14 by the DC voltage source 24, preferably about −1,000 volts, generates the electrostatic attractive force which holds the wafer 12 on the upper surface of the pedestal.

A smooth layer 44 of dielectric material is bonded to the smooth upper surface 40 of the pedestal 14 for contacting an under surface 46 of the wafer 12. The layer 44 of dielectric material uniformly covers the entire upper surface 40 of the pedestal 14, except over the four lift pin holes 66. Preferably the pedestal is machined from an aluminum block which is finished to a smoothness and parallelism of less than 0.001 inch between the upper and lower faces 40 and 36, respectively. Holes are then bored in the pedestal as described below. The upper face 40 of the pedestal is bead blasted to improve adhesion, and then an approximately 0.020 inch thick ceramic dielectric layer 44 of alumina or an alumina/titania composite is then plasma-sprayed over the upper face 40 of the pedestal. The sprayed layer is then ground to achieve a dielectric coating thickness of about 0.010 inch (254 microns) with a smoothness of 0.5 microns.

A cooling gas, such as helium, is fed to the pedestal 14 through an inlet 52 and distributed into each of seven axially oriented gas conduits or cavities 48 within the pedestal. Each conduit is about 0.3 inch in diameter. One conduit 48a is at the center axis of the pedestal, and the other six conduits 48b–48g are spaced evenly around, and somewhat inward from, the periphery of the pedestal. Unlike conventional designs, the conduits do not penetrate the dielectric layer 44. In fact, the conduits preferably do not quite extend all the way to the upper surface of the pedestal 14, but instead leave a thin layer 60 of aluminum, preferably about 0.015 inch thick, above the upper end 50 of each conduit 48. Each conduit may be formed by counterboring a hole from the underside 36 of the pedestal block.

The cooling gas is transported from each conduit or cavity 48 to the surface 54 of the dielectric layer 44 via a plurality of perforations 58, each perforation being at least an order of magnitude smaller in diameter than the conduits 48. Preferably, laser drilling is used to create perforations of about 0.006 to 0.008 inch in diameter through the dielectric layer 44 and the thin layer 60 of aluminum overlying each conduit 48. Several such perforations are formed above the upper end 50 of each gas conduit or cavity 48.

To distribute the cooling gas from the perforations 58 over the upper face 54 of the dielectric layer 44, a pattern 18 of one or more gas distribution grooves 56a and 56b is formed in the upper face 54. A single groove 56a or 56b may intersect any number of the perforations 58, but each perforation communicates with at least one groove. The grooves should extend over most of the surface 54 of the dielectric so that, when a semiconductor substrate or other article 12 is placed on the E-chuck, the cooling gas will flow up through the conduits 48, through the perforations 58, through the distribution grooves 18, and into the microscopic interstitial spaces between the underside 46 of the substrate and the upper surface 54 of the dielectric layer.

Figure 6:
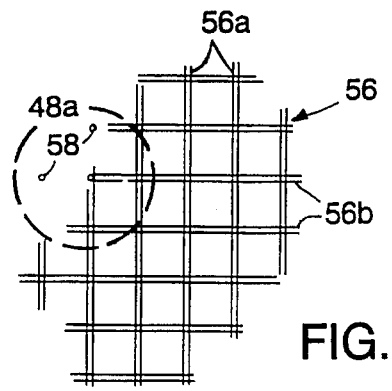
FIG. 6 is an enlarged showing of the portion of the pedestal within the circle 6 in FIG. 2 more clearly illustrating the intersecting nature of the grooves and gas distribution holes formed at the intersection of such grooves over a cooling gas receiving hole.
Figure 5:
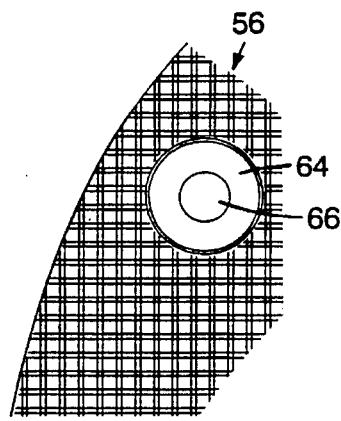
FIG. 5 is an enlarged showing of a portion of the pedestal within the circle 5 of FIG. 2 more clearly illustrating the intersecting nature of the grooves forming the gas distribution system, a lift pin hole having an annulus there around free of intersecting gas distributing grooves and a portion of an outer annulus bounding a central portion of the pedestal also free of intersecting gas distributing grooves.

In the preferred embodiment, the gas distribution grooves 18 are formed as a matrix of linear grooves in two orthogonal directions, as shown in FIGS. 5 and 6. Perforations 58 are provided where two orthogonal grooves intersect directly above a gas conduit 48, thereby permitted cooling gas to flow from the conduit, through the perforations, into the two intersecting grooves, and through these grooves to all grooves they intersect, and so on. The parallel grooves are spaced 0.1 inch apart, so that above each 0.3 inch diameter conduit 46 there are several groove intersections, each intersection being connected to the conduit via a perforation 58.

One consideration affecting the choice of groove spacing is that, to avoid any reduction in electrostatic clamping (or chucking) force between the E-chuck and the workpiece 12, the ratio of groove spacing to groove width should be large so that the gas distribution grooves do not occupy a significant fraction of the surface area 54 of the E-chuck. Another consideration, and a criterion that is much more difficult to satisfy, is that to achieve the best possible heat transfer between the workpiece and the E-chuck pedestal, the spacing between grooves should be no greater than roughly ten times the thickness of the workpiece, and more preferably no greater than one-half the thickness. The thickness of a typical 8-inch silicon wafer is only 0.03 inch, but currently it is considered economically impractical to laser machine gas distribution grooves with a closer spacing than 0.1 inch.

Figure 4:
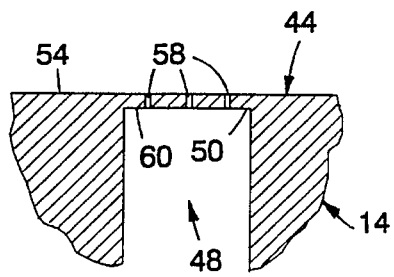
FIG. 4 is an enlarged illustration of the portion of the pedestal and layer of dielectric material within the circle 4 of FIG. 2 and shows the grooves defining the gas distribution system in the layer of dielectric material with gas distribution holes through intersections of the grooves and metal of the pedestal over the upper ends of the cooling gas receiving holes to define a cluster of gas distribution holes over each cooling gas receiving hole.
Figure 3:
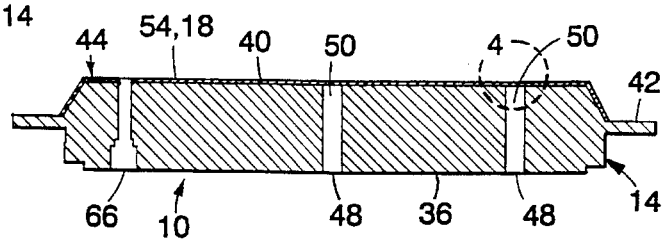
FIG. 3 is sectional side view along the lines 3—3 in FIG. 2 showing the internal construction of the pedestal and layer of dielectric material on the upper surface thereof with the cooling gas receiving holes extending vertically from an underside of the pedestal and a lift pin receiving hole for use in mechanically positioning and lifting the article being processed within the reaction chamber.

The grooves 18 are formed by laser machining the upper surface of the dielectric layer. Most of the grooves are 0.01 inch (254 microns) wide and 25 to 30 microns deep. These grooves are too small and dense to be shown clearly in FIGS. 2 and 2a, but they are represented by the dark, dense area 18 at the left of each of these two figures. These grooves are clearly shown as the dark lines which form a matrix or cross-hatch pattern in FIGS. 5 and 6, and they overlie the perforations 58 shown in FIG. 4. In addition, to further enhance gas distribution, above each of the conduits 48 is an orthogonal pair of larger grooves 70 which are illustrated in FIG. 2. These larger grooves are twice as wide and twice as deep as the other grooves.

An important feature of the present invention is that the E-chuck can be subjected to high power RF fields and high density plasmas immediately above the workpiece 12 without breakdown of the cooling gas due to arcing or glow discharge. One reason for this is that the top surface 40 of the pedestal is smooth, and the gas distribution grooves are formed in the dielectric layer rather than the metal pedestal. This minimizes discontinuities in the electric field above the E-chuck which otherwise could cause arcing. Another reason is that the groove depth is smaller than the sheath thickness of the plasma, so that a plasma cannot be sustained inside the groove, and it is small enough that the product of the groove depth and the cooling gas pressure is well below the value at which the cooling gas has a low glow discharge breakdown voltage according to the well known Paschen curve. Yet another reason is that the groove depth is shallow enough to leave a sufficiently thick dielectric layer beneath the groove to prevent breakdown of the dielectric.

Another, equally important feature of the invention which prevents breakdown of the cooling gas is the extremely small diameter (preferably about 0.007 inch) of the perforations 58 through which the cooling gas is transported to the surface 54 of the E-chuck. The small diameter of these holes prevents breakdown of the cooling gas passing therethrough for the same reasons explained earlier in conjunction with the depth of the distribution grooves and the same considerations limit the maximum diameter of the perforations as limit the depth of the grooves. In addition, their small diameter minimizes discontinuities in the electric field which could cause breakdown of the cooling gas passing therethrough. In a high density plasma system in which the cooling gas is supplied at a pressure of 15–20 Torr, the holes must generally be no larger than 20 mils. In the embodiments described herein, the selected size is around 6–8 mils.

Figure 7:
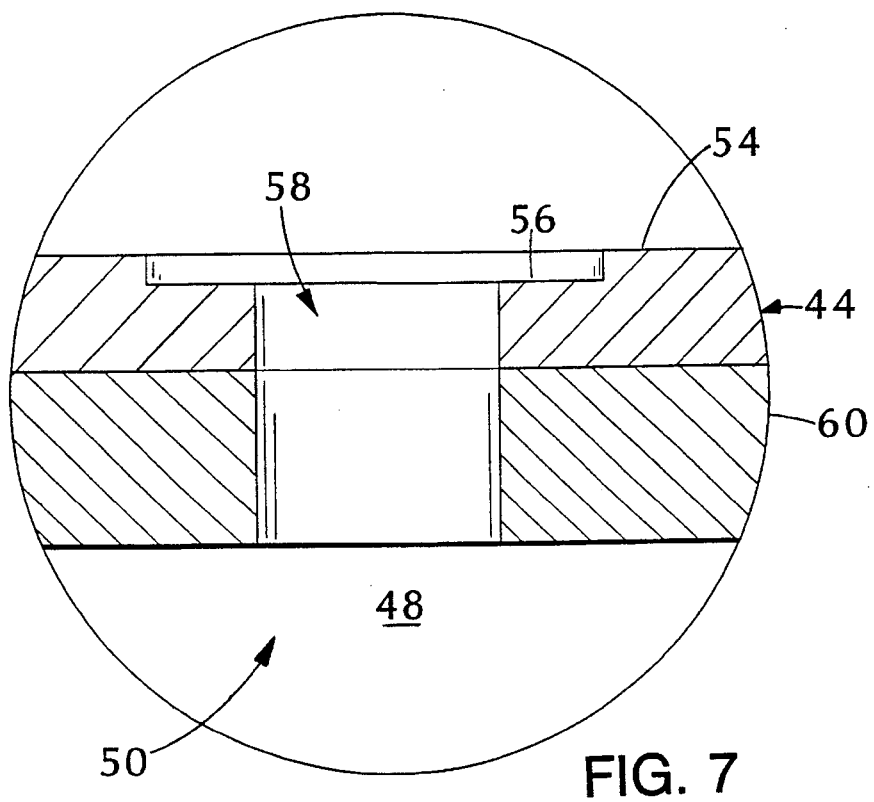
FIG. 7 is an enlarged showing of one form of gas distribution hole through the layer of dielectric material and the pedestal metal at the upper end of a cooling gas receiving hole.
Figure 8:
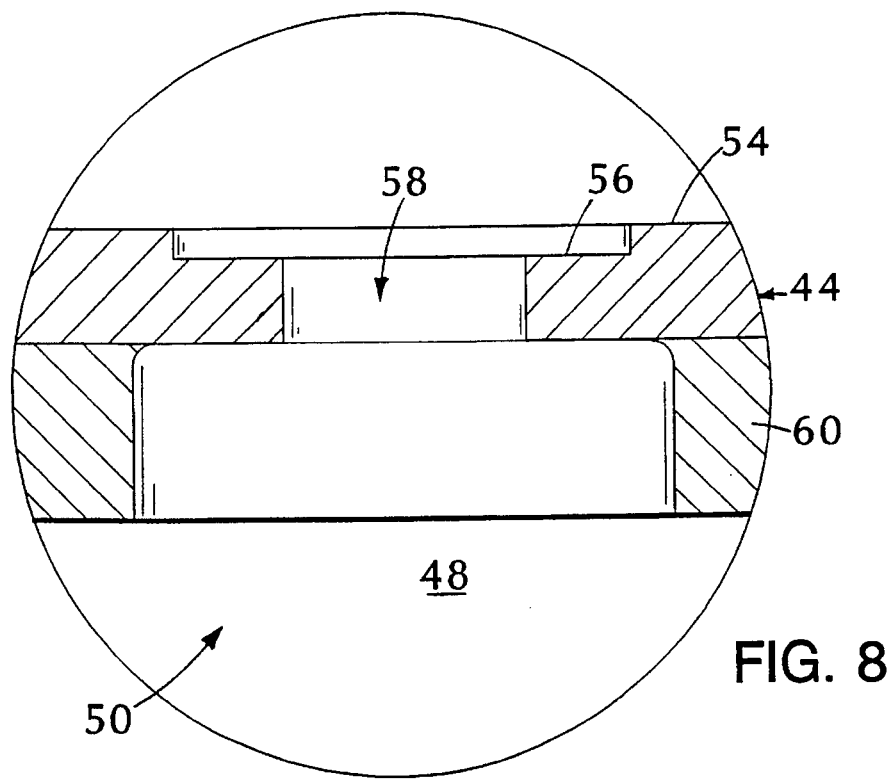
FIG. 8 is an enlarged showing of an alternate version of a gas distribution hole similar to that shown in FIG. 7.

Nevertheless, one shortcoming of the foregoing embodiment is that there is a line of sight path between the semiconductor substrate 12 above the perforation and the thin layer 60 of aluminum underlying the dielectric at the edge of the perforation, as shown in FIG. 7. Arcing could occur through this path, notwithstanding that the diameter of the perforation is otherwise small enough to avoid the previously discussed gas breakdown mechanisms. An alternative embodiment which avoids this problem employs laser machining to cut back the portion of the aluminum immediately adjacent the edge of each perforation 58, as shown in FIG. 8. This eliminates any line of sight path between the aluminum 60 and the substrate 12.

To facilitate robotic handling of the workpiece 12, four holes 66 for mechanical lift pins typically are provided in the pedestal. The lift pin holes generally are wide enough to cause gas breakdown problems if the cooling gas were permitted to enter the holes 66. To ensure the gas pressure inside the lift pin holes 66 is too low to undergo gas breakdown, the lift pins are connected to the same turbomolecular pump used to produce high vacuum (less than one Torr) in the plasma chamber 16. To seal the lift pin holes from the cooling gas, an annulus 64 between 0.125 to 0.200 inch wide in the dielectric layer is left smooth, without any gas distribution grooves. Since, as stated above, the dielectric is ground to a smoothness of 0.5 microns, when the clamping voltage 24 is applied the smooth underside of the semiconductor substrate 12 makes a gas tight seal against the annulus, thereby preventing cooling gas from entering the lift pin holes 66.

An Alternative Embodiment

Another embodiment of the invention, which is shown in FIGS. 9–16, includes a Helium cooling gas distribution system embodying many of the previously described principles. It has, however, an added advantage of allowing much greater flexibility in layout of the water cooling distribution system. As will become apparent, this is in large part due to elimination of the Helium gas distribution conduits that penetrate the E-chuck from its backside. These previously mentioned conduits (see conduits 48a–g in FIG. 2) are replaced by internal hidden cavities that are formed by one or more annular rings that are welded into corresponding grooves in the topside of the chuck. This alternative embodiment also achieves a more uniform temperature distribution across the wafer during a high density plasma processing. This is because the Helium is introduced to the interface between the E-chuck and the wafer near the locations which represent the greatest leakage of He, namely, around the periphery of the wafer and at lift pin holes. We refer to this approach as "feeding the leak."

Referring to FIGS. 9–12, an alternative embodiment of the E-chuck includes an aluminum pedestal 100 having a backside 102, an outer flange 104 for connecting the pedestal through the plasma chamber, and a cylindrical upper portion 106 with a top surface 108. Penetrating from the backside through the top surface are four lift pin holes 110 through which electrically non-conducting, ceramic lift pins (not shown) can pass to lift the wafer (also not shown) off of E-chuck pedestal 100 at the end of a process run. Pedestal 100 includes an annular groove 112 machined into its top surface close to its periphery. Welded into groove 112 is an annular ring 114 that has a channel 116 machined into its underside. Channel 116 penetrates ring 114 to within close proximity of the other side, leaving a thin layer 118 of metal separating channel 116 from the top side of ring 114 (e.g. having a thickness of about 0.015 to 0.020 inches). The thickness of ring 114 is less than the depth of groove 112, so that after ring 114 is pressed into groove 112, channel 118 and the lower portion of groove 112 form a peripheral internal cooling gas distribution manifold 120 around the periphery of E-chuck pedestal 100.

Figure 11:
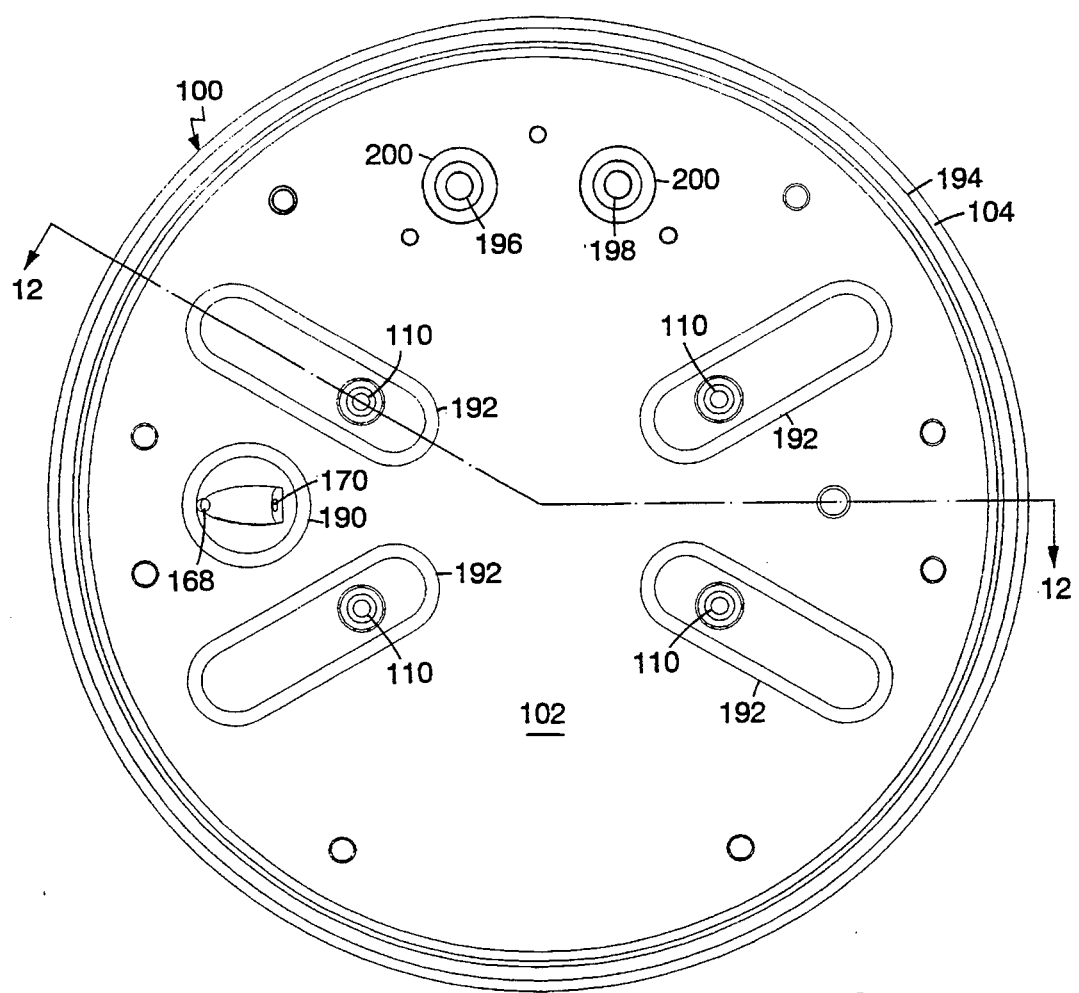
FIG. 11 shows the bottom of the pedestal of FIG. 9.

There are four smaller annular grooves 122 machined into top surface of E-chuck 100, each one centered on a different one of lift pin holes 110. Note that only one such groove is shown in FIG. 11. A smaller annular ring 124 having a channel 126 machined into its underside is welded into each of annular grooves 122. As with channel 116 in ring 114, channel 126 penetrates ring 124 to within close proximity of the other side, leaving a thin layer of metal separating channel 126 from the top side of ring 124. The thickness of ring 124 is less than the depth of groove 122, so that after ring 124 is welded into its corresponding groove 122, channel 126 and the lower portion of groove 122 form an internal lift pin cooling gas distribution manifold 130 around its lift pin hole 110.

Finally, located at the center of E-chuck pedestal 100 there is a hole 132 machined into top surface 108. A plug 134 having a cylindrical hollow 136 machined into its underside is welded into hole 132. Hollow 136 penetrates plug 134 to within close proximity of the other side, leaving a thin layer of metal separating hollow 136 from the top side of plug 134. The thickness of plug 134 is less than the depth of hole 132, so that after plug 134 is welded into hole 132, hollow 130 and the lower portion of hole 132 form a central cooling gas distribution manifold 138 located at the center of E-chuck pedestal 100.

As in the previously described embodiment, a thin uniform dielectric layer 140 covers the top surface of E-chuck pedestal 100. In the figures, the thickness of thin dielectric layer 140 relative to thickness of pedestal 100 is grossly exaggerated for purposes of illustration. In the described embodiment, the thickness of dielectric layer 140 is actually about 0.007 inches (178 microns).

A network of grooves formed in the surface of dielectric layer 140 distributes the Helium cooling gas to the interface between the E-chuck and the wafer during plasma processing. The network includes a rectangular grid 150 of grooves 152 that densely cover most of the surface of dielectric layer. In FIG. 10 only a portion of the full grid of grooves 152 is shown for clarity. As with the network of grooves previously described in connection with FIG. 2, the grooves within this network do not penetrate through the dielectric layer into the metal of pedestal 100. In the described embodiment, the grooves of grid 150 are 0.01±0.001 inch (0.25±0.025 mm) wide and 30±3 micron deep and there is a separation between adjacent grooves of 0.100±0.003 inch (2.50±0.075 mm). The grooves of rectangular grid 150 terminate before the outer periphery of the E-chuck leaving a smooth dielectric annular region 154 at the outer periphery of the E-chuck. In the described embodiment, this smooth area around the periphery is about 0.175–0.200 inch (4.4–5.1 mm) wide.

Grooves 152 of rectangular grid 150 also terminate before reaching lift pin holes 110, thereby leaving a circular region 156 of smooth dielectric centered on each of the lift pin holes 110. The smooth dielectric regions 154 and 156 form seals with the backside of the wafer thereby significantly reducing the leakage of Helium cooling gas at the periphery of the wafer and into the lift pin holes during processing.

The network of grooves also includes a single circular groove 158 formed about the periphery of dielectric layer 140 and centered directly above channel 116 in annular ring 114 (i.e., above peripheral manifold 120) and four circular grooves 160, each one centered on a different one of the four lift pin holes 110 and directly above channels 126 of the four smaller annular rings 124 (i.e., above the lift pin manifolds 130). There is also a vertical groove 162 and a horizontal groove 164, each bisecting the surface of dielectric layer 140. In the described embodiment, grooves 158–164 are 0.03±0.001 inch (0.76±0.03 mm) wide and 40±3 micron deep.

Figure 12:
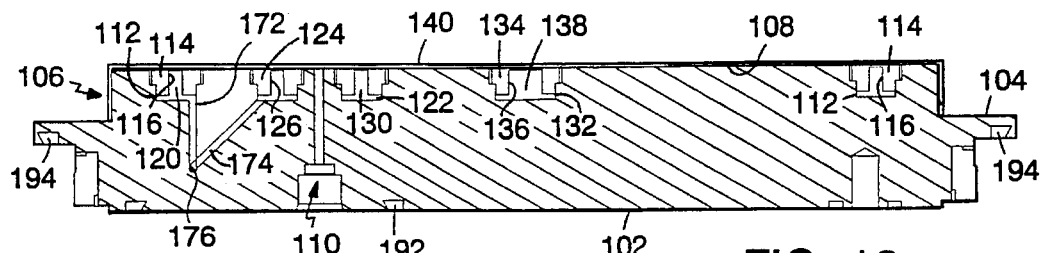
FIG. 12 shows a cross-section of the pedestal of FIG. 11 taken along the B—B section line in FIG. 11.

Referring to FIG. 10, Helium cooling gas reaches annular peripheral manifold 120 through a single passage 168 that is drilled perpendicularly into pedestal 100 from backside 102. Helium cooling gas reaches central manifold 138 through a second passage 170 that is also drilled into pedestal 100 from backside 102 beginning at a location near the entry point of passage 168 and angled appropriately to reach central manifold 138. As seen in FIG. 12, Helium cooling gas is supplied to internal lift pin manifold 130 from peripheral annular manifold 120 through another set of passages 172 and 174. Passage 172 is drilled perpendicularly into pedestal 100 in the bottom of groove 112 and passage 174 is drilled at an angle into pedestal 100 in the bottom of groove 122. Passages 172 and 174 are located and oriented so that they intersect at a point 176 within the body of the E-chuck, thereby forming a conduit through which the Helium cooling gas can reach the smaller annular manifold 130 from the peripheral manifold 120. Each lift pin manifold 130 is connected to the larger peripheral manifold 120 in a similar manner.

Helium cooling gas is supplied to the system of larger grooves 158–164 on the surface of dielectric layer 140 through a plurality of perforations connecting the underlying, hidden cooling gas distribution manifolds 120, 130, and 138 within E-chuck to those grooves. For example, as shown in FIGS. 13 and 14, perforations 180, evenly distributed along the bottom of groove 158, pass through to the hidden underlying manifold 120 (not shown in FIG. 14). For an 8 inch wafer chuck, there are about 180 such perforations in groove 158, each of which is 0.007±0.001 inch (0.175±0.025 mm) diameter. Similarly, referring to FIG. 15, around each lift pin hole 110, perforations 182 connect smaller manifold 130 to groove 160. And referring to FIG. 16 at the center of pedestal 100, five perforations 184 connect underlying manifold 138 to the vertical and horizontal grooves 162 and 164. As should be readily apparent, the system of perforations connects the underlying gas distribution system with the set of the larger grooves, which in turn, communicates with (i.e., intersects) all of the smaller grooves 152 of grid 150.

Referring to FIG. 11, various 0-ring grooves are machined into backside 102 of pedestal 100. An 0-ring groove 190 encircles the two entry points of passages 168 and 170; an oval-shaped 0-ring groove 192 encircles each of the lift pin holes 110; and an 0-ring groove 194 is formed around outer flange 104 of pedestal 100. Also shown in FIG. 2 are two water distribution holes 196 and 198 for supplying cooling water to the water distribution chamber in the lower half of pedestal 100. Holes 196 and 198 are also each surrounded by 0-ring grooves 200. The 0-rings which go into these 0-ring grooves isolate the different systems (i.e., water, cooling gas, and processing chamber) from each other.

The water distribution system could be any of a number of alternative designs including, for example, a radial groove layout or a spiral groove layout. Because much of the Helium cooling gas distribution system is located in the upper half of the E-chuck, there are fewer obstacles which the water distribution system must avoid as compared to the previously described embodiment in which cooling gas distribution cavities were drilled into the E-chuck from the backside.

The E-chuck is assembled in the following manner. First, the annular ring inserts are press fit into their corresponding manifold grooves. Then using either a laser or an electron beam, the inserted annular rings are welded into the E-chuck. After the welding is complete, the surface of the E-chuck is flycut to clean it, i.e., to remove the welding buildup where the rings were welded into the E-chuck. During this process, the Al pedestal is cut back until the thin Al layer above the hidden manifolds is about 0.015 to 0.020 inch (0.375–0.500 mm) thick. After flycutting is complete, the surface is bead blasted to prepare it for application of the dielectric material. Then, the dielectric material (e.g. alumina or alumina/titania) is sprayed (e.g. plasma-sprayed) onto a thickness that is greater than the final desired thickness (e.g. 15–20 mil or 380–508 microns). After the dielectric material has been applied, it is ground back to the desired final thickness (e.g. 7 mil or 180 microns). Using a laser, the desired pattern of cooling gas distribution grooves are cut into the surface of the dielectric layer. Then, the perforations which connect the grooves to the underlying cooling gas distribution cavities within the E-chuck are drilled. The drilling may be done using either a laser or mechanical drill. In the described embodiment, an excimer UV laser (i.e., a short wavelength, high energy laser) is used and it is run at a relatively low time averaged power level. This helps to reduce the risk of redepositing drilled Al from the Underlying thin layer onto the walls of the perforations and onto the surface of the dielectric.

Note that the order of these steps can be altered. For example, it may be desirable to drill the perforations before cutting the grooves in the dielectric layer.

Figure 17:
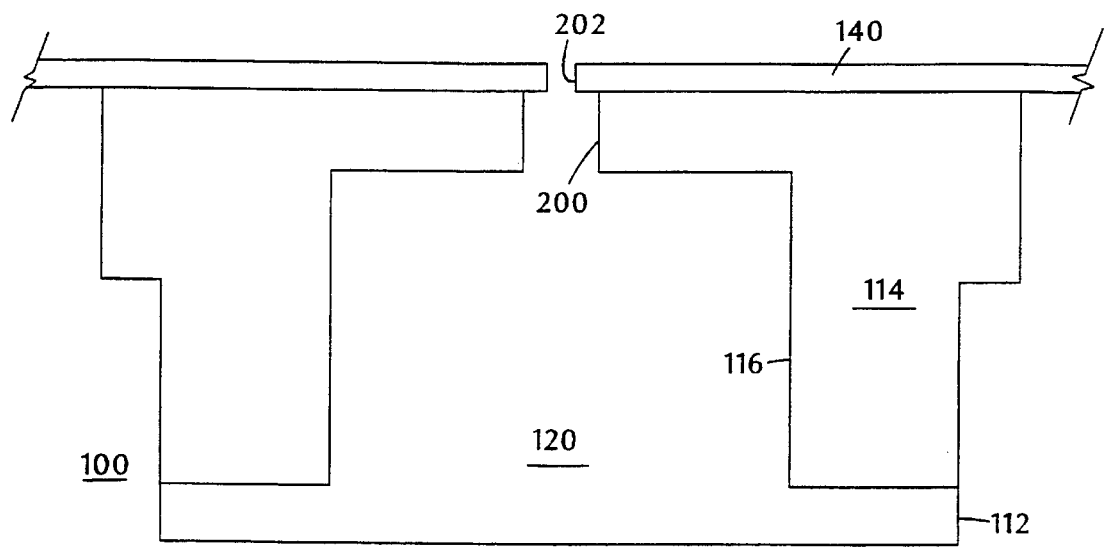
FIG. 17 shows a cross-sectional view of an alternative perforation design for carrying cooling gas to the underside of the wafer.

Referring to FIG. 17 shows an alternative design for the internal structure of the perforations. For purposes of illustration, a close up cross-sectional view of annular insert 114 is shown. It should be understood, however, that the following description applies to all of the perforations in the E-chuck. The illustrated perforation is formed by a first hole 200 passing through the underlying thin Al layer and a smaller diameter, second hole 202 aligned with the first hole passing through dielectric layer 140 to the surface. Both holes 200 and 202 share the same axis. As with the perforation described previously in connection with FIG. 8, the diameter of first hole 200 is chosen to be sufficiently large so that no line of sight path exists between the wall of the first hole in the thin underlying Al layer and the space above the dielectric layer. For a dielectric layer of 0.007 inch (0.178 mm) thickness, a small hole diameter of about 0.007 inch (0.178 mm), and a thin Al layer thickness of about 15–20 mils (380–508 microns), a large hole diameter of about 15–20 mils (380–508 microns) may be used.

Figure 18:
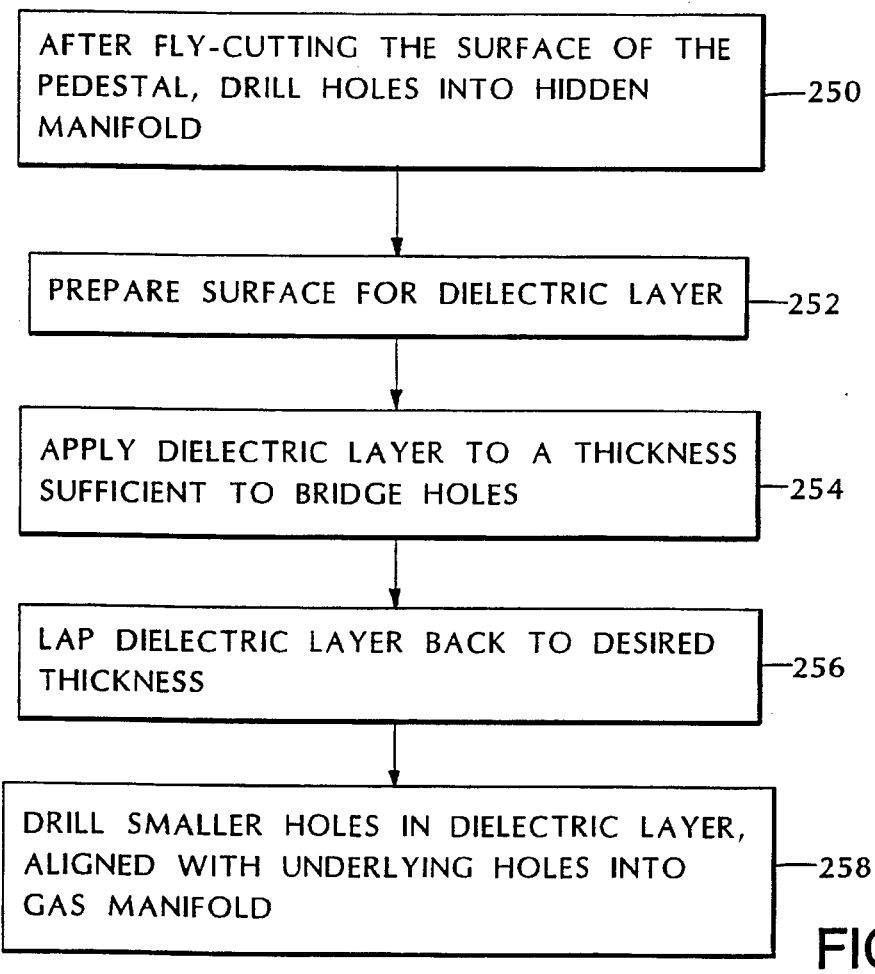
FIG. 18 is a flow chart of the sequence for producing the perforation shown in FIG. 17.

Since access to the backside of the thin layer separating the hidden manifold from the dielectric layer is not available to make the second larger diameter hole, the earlier described fabrication technique is not appropriate for this embodiment. To produce the perforations with the stepped diameter passageway, the previously described fabrication technique must be modified as shown in FIG. 18. Before applying the dielectric layer, drill thru holes into welded inserts at all of the locations where perforations through the dielectric layer are desired (step 250). After all thru holes have been drilled, bead bast the surface of the Al block to prepare it for the dielectric material (step 252). Then, spray a dielectric material onto the prepared surface in an amount and to a thickness sufficient to close up the thru holes (step 254). Once the thru holes are covered over, grind back the dielectric layer to achieve the desired thickness and uniformity (step 256). Then, drill the set of smaller diameter first holes through the dielectric layer and in alignment with the underlying larger diameter second holes (step 258).

Note that pedestal 100 includes an alignment edge 260 (see FIG. 9) which may be used to assist in aligning the first holes with the hidden holes in the Al. Alternatively, any of the other well known alignment mechanisms may be used to assist in aligning the successive drilling operations.

The Quartz Protective Collar

Figure 19:
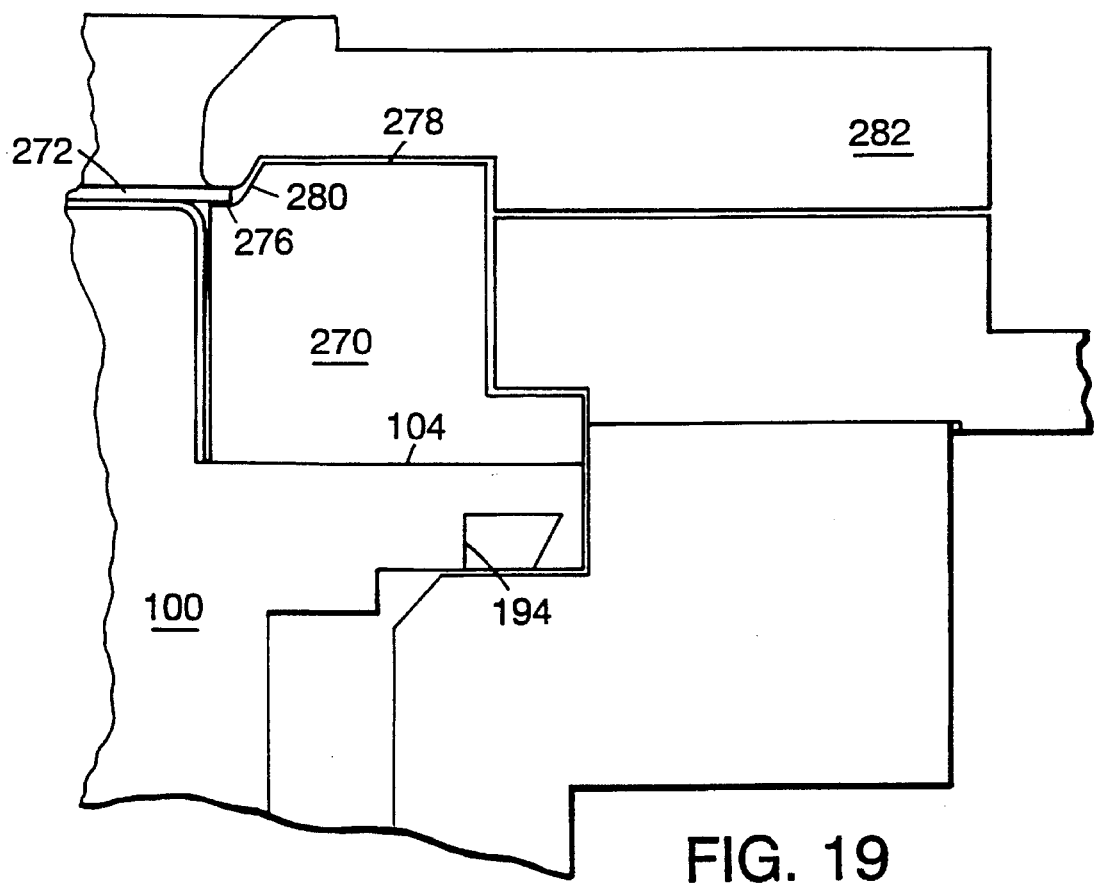
FIG. 19 is an enlarged cross-sectional partial view of the pedestal with a collar and a cover ring in place.
Figure 20:
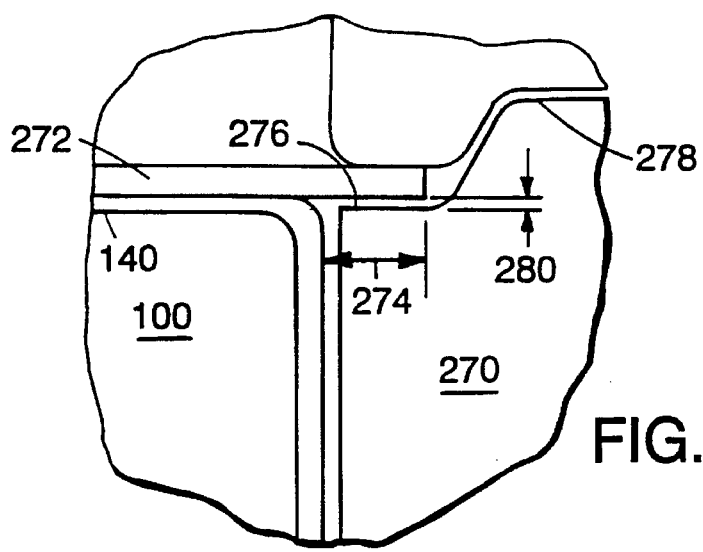
FIG. 20 is a closeup view of the gap and the overlap formed between the underside of the wafer and the collar shown in FIG. 19.

Referring to FIGS. 19 and 20, when used in a process chamber, pedestal 100 is surrounded by a generally annular quartz collar 270 which aligns a wafer 272 over pedestal 100 and shields pedestal 100 from the plasma during processing. The diameter of the top cylindrical portion of pedestal 100 is slightly less than diameter of wafer 272. Thus, when wafer 272 is aligned onto pedestal 100, its perimeter extends slightly beyond pedestal 100 thereby forming an overlap 274. Collar 270, which has an inside diameter which is slightly larger than pedestal, fits over the top of pedestal 100 and rests on the top of flange 10. It includes a flat annular top ledge 276 around its inside perimeter and rises in the outward radial direction to a higher top surface 278. The transition from ledge 276 to top surface 278 forms an angled annular wall 280 (i.e., a surface that represents a surface of a frustum of a cone) that is slightly larger in diameter than the wafer for which the E-chuck is designed. When wafer 272 is placed on pedestal 100, the angled wall of wall 280 urges the wafer to center itself on the pedestal as it comes to rest flat against the pedestal. Annular wall 280 also limits the distance by which the wafer can shift laterally on the surface of the pedestal. That is, annular wall 280 establishes the minimum and maximum amount of overlap 274 (see FIG. 20) that can occur when placing the wafer on the E-chuck. In addition, ledge 276 is slightly lower than the top surface of dielectric layer 140; thus, the underside of wafer 272 is separated from ledge 276 by a gap 280. To prevent plasma from penetrating to the pedestal during processing, gap 280 is designed to be small relative to the size of the plasma dark space formed above the wafer during processing and the ratio of minimum overlap to gap size is designed to fall within a range of about 5:1 to 10:1. With a gap and overlap that meets these design criteria, the plasma will pinch off before it penetrates any significant distance into the narrow channel formed by the underside of wafer 272 and ledge 276.

In the described embodiment which is designed to handle 8 inch (200 mm) wafers, the outside diameter of the top cylindrical portion of pedestal 100 is about 7.774 inch (195 mm) and the inside diameter of collar 270 is about 20 mils (0.5 mm) larger than this. To assemble collar 270 the upper cylindrical portion of pedestal 100, the upper portion is first wrapped with a plastic (e.g. polyimide) tape (not shown) and then cooled, thereby causing it to contract slightly and ease the assembly of collar 270 onto pedestal 100. The diameter of annular wall 280 of collar 270 is such that overlap 274 will be at least about 1.25 to 1.5 mm under worst case alignment. That is, the outer perimeter of wafer 272 will extend beyond pedestal 100 by at least that amount. The height of ledge 276 such that gap 280 is about 5±2 mils (0.125±0.050 mm).

Also shown in FIGS. 19 and 20 is an optional clamp ring 282 that rests on top of wafer 272. Clamp ring 282 serves to protect the pedestal from the plasma during processing. However, if the E-chuck is designed in accordance with the above-described criteria, it can be run without clamp ring 282.

Chucking and Dechucking Procedure

In accordance with another aspect of the invention, a new procedure has been developed removing the wafer after plasma processing. The procedure allows for rapid, repeatable dechucking without risk of causing charging damage to any devices on the wafer. A typical process run includes a chucking sequence, a main etch sequence, and a dechucking sequence. The chucking sequence is that sequence of steps performed prior to and in preparation for the processing phase, e.g. the etching of the wafer. The dechucking sequence is that sequence of steps which is performed after processing is finished to remove the wafer from the chamber. Under conventional approaches to dechucking, the Helium cooling gas is used to pop the wafer off the E-chuck during the discharge phase, i.e., after the E-chuck has been grounded so as to reduce the electrostatic force. This creates certain problems, however. For example, the wafer comes up off of the E-chuck in an unstable manner and it tends to skate off the chuck. In addition, we have learned that the time that it takes to dechuck the wafer is highly dependent on how long the wafer had been chucked and on how many wafers were run prior to the current wafer. The longer that one runs the system and the greater the number of wafers that are run, the harder it is to dechuck the current wafer. This also meant that the force for chucking tends to be reduced over time because of an accumulated charge on the surface of the E-chuck.

Figure 21A:
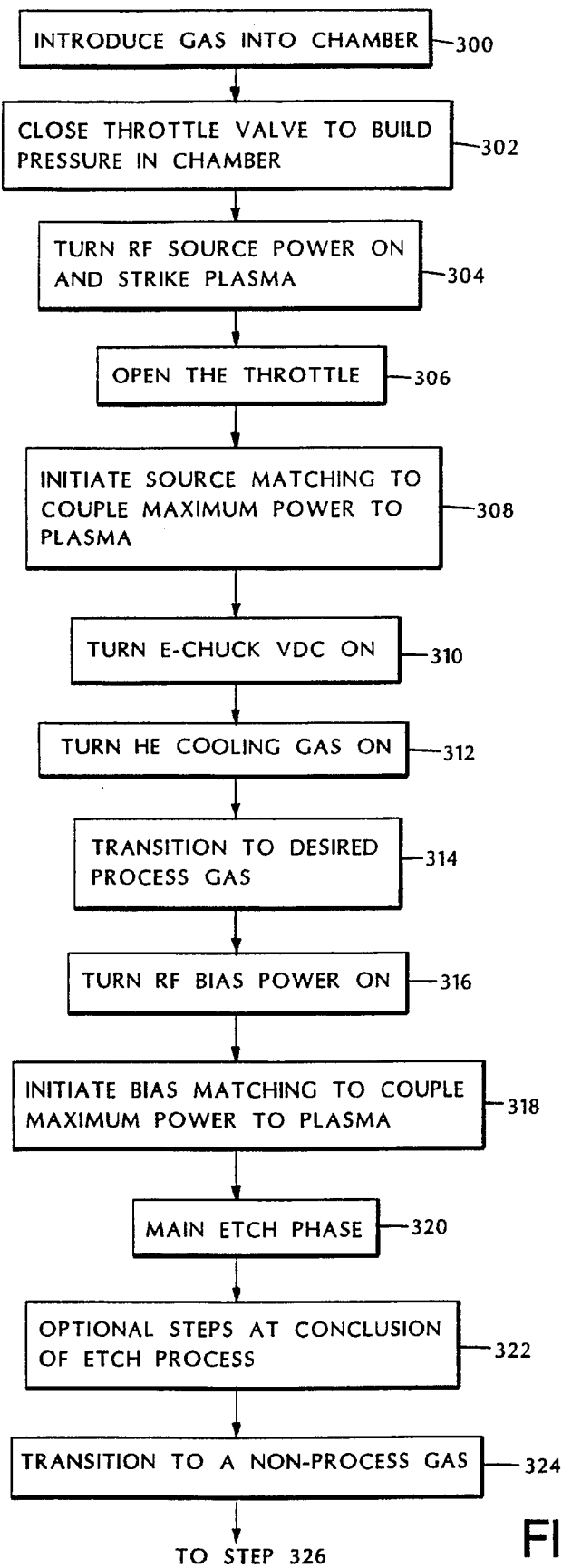
FIGS. 21A–C present a flow chart of the wafer chucking and dechucking procedure and the post process procedure for reducing residual charge on the E-chuck.
Figure 21B:
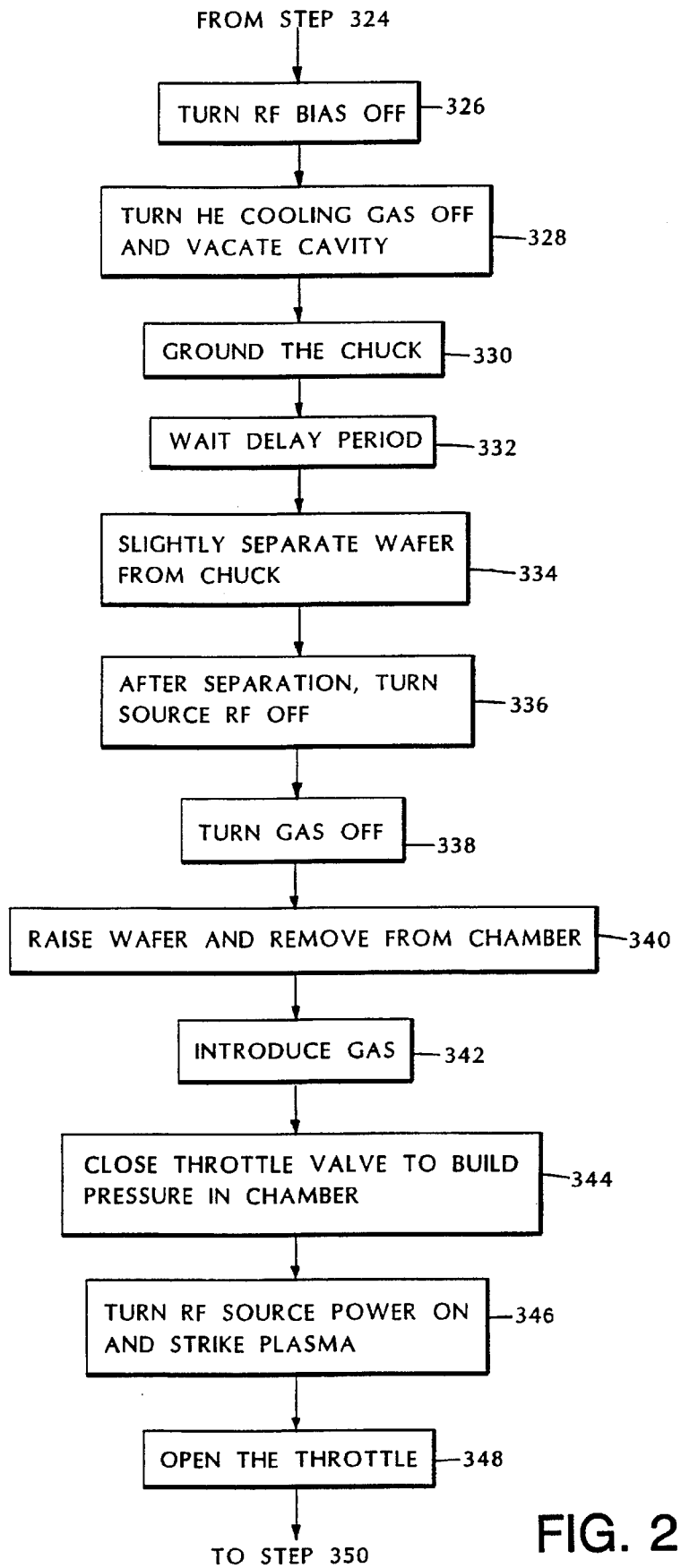
Figure 21C:
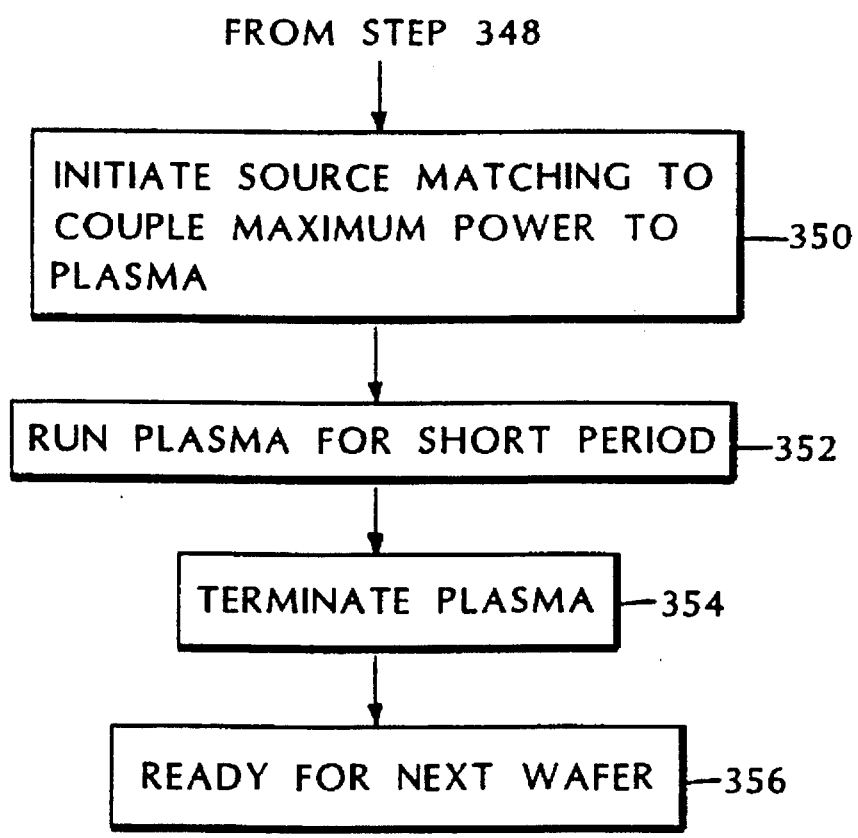

A procedure which avoids some of these problems is shown in FIGS. 21A–C. For completeness, both the chucking and the dechucking sequences are described for a system such as is shown in FIG. 1.

Typically, the chucking sequence includes the following steps. After the wafer has been placed on the E-chuck, gas (e.g. argon) is introduced into the chamber (step 300). A throttle valve to the pump used to evacuate the chamber is then closed to allow the gas pressure in the chamber to build up (step 302). Once the gas pressure has increased to an appropriate level, the RF source power is turned on (step 304), using a preselected set of conditions that electrostatically strikes a plasma at the increased gas pressure. In general, the voltage of the inductive antenna surrounding the chamber is increased to a level high enough to cause avalanche breakdown between the grounded electrode and the RF antenna. Once the plasma has been initiated, the throttle valve is opened to bring down the pressure in the chamber (step 306). In the meantime, the source matching network is initiated to couple maximum power to the plasma (step 308). These last two steps cause the plasma to switch into an inductive mode.

The following sequence of steps are then performed in rapid succession. The D.C. bias voltage to the E-chuck is turned on (step 310) and the Helium cooling gas is turned on (step 312). The D.C. bias voltage is typically more negative than −500 volts (e.g. in the described embodiment it is about −1000 to −1200 volts) and the Helium pressure is about 15 Torr. The D.C. bias could, of course, be positive. The advantage to using a negative voltage, however, is that the pedestal will reject the higher charge-to-mass ratio electrons in the plasma in favor of the lower charge-to-mass ratio ions and this will tend to reduce the risk of damage occurring to the pedestal from the plasma.

Next, a transition to the desired process gas is initiated (step 314). During the transition, the RF bias power is turned on (step 316) and the bias matching network is initiated to couple maximum power to the plasma under the new conditions (step 318). At this point, the main etch process has begun (step 320) and it is run for the desired length of time. Optional steps may also be added at the conclusion of the etch process including, for example, running $O_2$ gas for a possible descum step (step 322).

Note that the exact order of some of the events in the chucking sequence may be altered. In addition, steps may be added or omitted depending upon the requirements of the particular plasma system in which the plasma processing takes place. The above operations and the order in which they are presented was chosen for illustrative purposes and to provide a picture of a complete run sequence.

The dechucking sequence is commenced after the etching process and subsequent optional steps are completed. The following sequence of steps is performed rapidly to avoid temporarily switching to a deposition process. First, there is a transition to a non-process gas (e.g. Ar or $O_2$) (step 324). Then, the RF bias is turned off thereby causing the wafer to move to a potential determined by the plasma (typically a slightly positive voltage) (step 326). In the meantime, the Helium cooling gas is also turned off and a process of evacuating the residual Helium from the cooling gas distribution system is begun (step 328). As this is taking place, the E-chuck is grounded (step 330). A next operation is not initiated until a preselected delay period has elapsed (e.g. 5 seconds) (step 332). After the delay period has elapsed, the pneumatically operated lift pin mechanism is used to slightly separate the wafer from the E-chuck (e.g. by a distance of about 10 to 60 mils) (step 334). The separation step is performed gently, typically taking several seconds to complete. The preceding delay is required to allow a residual internal charge that is typically present at the interface between wafer and E-chuck to decay. This residual charge results in a residual force holding the wafer to the E-chuck, thus if the lifting operation is performed too soon after grounding the E-chuck, the lift pins may break the wafer. During the separation operation, the RF source plasma provides a path for further discharging any charge caused by the separation operation.

Once the wafer is separated from the E-chuck, the source RF is turned off (step 336), the non-process gas is turned off (step 338), and the lift pins are used to raise the wafer to about 0.500 inch above the E-chuck. Then, the wafer can be removed from the chamber (step 340). This completes the dechucking sequence.

Since there may still be a residual charge left on the E-chuck, a post processing procedure may be appropriate to eliminate any possible residual charge. The post processing procedure immediately follows the removal of the wafer and begins by turning on a non-reactive gas (e.g. Ar) in preparation for starting a new plasma. The sequence of steps 342 to 350 which are followed to start the plasma and switch to an inductive mode are the same as those which previously described, namely steps 300 to 308.

After the plasma has been produced in the chamber, it is run for a preelected period of time, e.g. about 10 seconds (step 352). During this phase, any residual charge that may remain on electrostatic chuck is removed. The time required may be greater than 10 seconds, it depends upon the duration of the plasma processing run for the previous wafer and may also depend on the number of wafers that have been processed in the chamber since he last post processing phase.

After the plasma has run for the desired period of time, it is terminated (step 354) and the chamber is ready for the next wafer (step 256).

It should be understood, of course, that the above-described sequence of operations can be, and indeed would likely be, automated through a software control program. It can be programmed to occur after each wafer is processed or run only after a sequence of wafers have been processed in the chamber.

Other embodiments of the invention are within the following claims.

What is claimed is:

1. A method for dechucking a wafer from an electrostatic chuck at the completion of a plasma process during which process a plasma is generated in a plasma chamber by RF source power, the wafer is held on the chuck by a DC potential, and said electrostatic chuck supplies a cooling gas to a backside of said wafer, said dechucking method comprising:

at the completion of said plasma process and while the RF source power is still on, turning off said cooling gas;

changing said DC potential of said electrostatic chuck;

slightly separating said wafer from said electrostatic chuck while said RF source plasma is still present;

after slightly separating said wafer from said electrostatic chuck, turning off the RF source power;

after turning off the RF source power, further separating said wafer from said electrostatic chuck; and removing said wafer from said plasma chamber.

2. The dechucking method of claim 1 further comprising the step of beginning a process of vacating the cooling gas from said electrostatic chuck prior to slightly separating said wafer from said electrostatic chuck.

3. The dechucking method of claim 1 wherein the step of slightly separating said wafer from said electrostatic chuck involves raising said wafer to a distance of no greater than 60 mils above said electrostatic chuck.

4. The dechucking method of claim 3 wherein the step of slightly separating said wafer from said electrostatic chuck involves raising said wafer to a distance of between 10 and 60 mils above said electrostatic chuck.

5. The dechucking method of claim 1 wherein the step of slightly separating said wafer from said electrostatic chuck comprises using lift pins that are located within said electrostatic chuck to raise said wafer.

6. The dechucking method of claim 5 wherein said lift pins are made of a non-conducting material.

7. The dechucking method of claim 6 wherein said lift pins are made of a ceramic material.

8. The dechucking method of claim 1 further comprising the step of waiting a preselected delay period after changing said DC potential of said electrostatic chuck and before slightly separating said wafer from electrostatic chuck.

9. The dechucking method of claim 8 wherein the preselected delay period is at least 5 seconds.

10. The dechucking method of claim 1 wherein said electrostatic chuck is biased at a first potential during plasma processing and wherein the step of changing said DC potential of said electrostatic chuck involves reducing said DC potential of said electrostatic chuck to a second potential that is lower than the magnitude of the first potential.

11. The dechucking method of claim 10 wherein said wherein said second potential is at ground potential.

12. The dechucking method of claim 10 wherein said first potential is a negative voltage relative to ground potential.

13. The dechucking method of claim 12 wherein said first potential is more negative than about −500 volts relative to ground potential.

14. The dechucking method of claim 13 wherein said electrostatic chuck is biased by RF bias power during plasma processing and further comprising the step of: at the completion of said plasma process and while the RF source power is still on, turning off said RF bias power.

* * * * *